United States Patent
Wheeler et al.

(10) Patent No.: US 9,450,022 B1
(45) Date of Patent: Sep. 20, 2016

(54) MEMRISTOR DEVICES AND FABRICATION

(75) Inventors: Dana C. Wheeler, Santa Monica, CA (US); Tahir Hussain, Calabasas, CA (US); Yakov Royter, Santa Monica, CA (US); Eason F. Wang, Culver City, CA (US)

(73) Assignee: HRL Laboratories, LLC, Malibu, CA (US)

( * ) Notice: Subject to any disclaimer, the term of this patent is extended or adjusted under 35 U.S.C. 154(b) by 23 days.

(21) Appl. No.: 13/604,559

(22) Filed: Sep. 5, 2012

(51) Int. Cl.
*H01L 27/24* (2006.01)
*H01L 21/00* (2006.01)

(52) U.S. Cl.
CPC .................. *H01L 27/2418* (2013.01)

(58) Field of Classification Search
CPC ........... H01L 21/8239; H01L 45/1253; H01L 45/00; H01L 21/02; H01L 27/24; H01L 29/86; H01L 21/00
USPC ............. 257/9, 2–5, 319, E21.006, E21.085, 257/E21.209, E21.645, E45.003, E45.002; 438/900, 104, 486, 692, 382; 365/148, 365/103, 163, 158, 51
See application file for complete search history.

(56) References Cited

U.S. PATENT DOCUMENTS

| | | | |
|---|---|---|---|
| 6,933,218 B1* | 8/2005 | Lee et al. ...................... | 438/591 |
| 7,799,702 B1* | 9/2010 | Tanaka ..................... | H01L 27/24 438/758 |
| 8,008,648 B2* | 8/2011 | Bratkovski et al. ............. | 257/14 |
| 8,395,139 B1* | 3/2013 | Ho ...................... | H01L 27/2454 257/331 |
| 8,501,621 B2* | 8/2013 | Kochergin ................... | 438/658 |
| 8,558,212 B2* | 10/2013 | Jo ......................... | H01L 45/085 257/4 |
| 2006/0246606 A1* | 11/2006 | Hsu ....................... | H01L 27/101 438/3 |
| 2007/0035027 A1* | 2/2007 | Gonzalez .......... | H01L 21/28518 257/758 |
| 2009/0101883 A1* | 4/2009 | Lai .......................... | H01L 45/06 257/3 |
| 2011/0076825 A1* | 3/2011 | Lung ................... | G11C 11/5678 438/381 |
| 2011/0161605 A1* | 6/2011 | Lee ..................... | G11C 13/0007 711/154 |
| 2011/0169136 A1* | 7/2011 | Pickett .................... | H01L 27/24 257/537 |
| 2011/0220860 A1* | 9/2011 | Kim .................... | G11C 13/0007 257/4 |
| 2011/0220861 A1* | 9/2011 | Himeno .............. | H01L 27/0688 257/4 |
| 2012/0104343 A1* | 5/2012 | Ramaswamy .......... | H01L 45/04 257/3 |
| 2012/0127779 A1* | 5/2012 | Scheuerlein ............. | G11C 5/02 365/148 |

(Continued)

OTHER PUBLICATIONS

Kim, Kuk-Hwan, et al. "A Functional Hybrid Memristor Crossbar-Array/CMOS System for Data Storage and Neuromorphic Applications." NANO Letters (2012), vol. 12, pp. 389-395. (published on Dec. 5, 2011).

(Continued)

*Primary Examiner* — Julio J Maldonado
*Assistant Examiner* — Sheikh Maruf
(74) *Attorney, Agent, or Firm* — Ladas & Parry

(57) ABSTRACT

A method for fabricating a digital memristor crossbar array includes applying a protective layer on at least a portion of a memristive layer. A method for fabricating an analog memristor crossbar array includes providing a self-aligning first electrode layer. An analog memristor includes a memristive layer bar arranged to self-align said second electrode on said memristive layer along its length.

5 Claims, 13 Drawing Sheets

(56) References Cited

U.S. PATENT DOCUMENTS

| | | | |
|---|---|---|---|
| 2012/0132880 A1* | 5/2012 | Bratkovski | G11C 13/0007 257/3 |
| 2012/0262973 A1* | 10/2012 | Liu | H01L 27/1021 365/51 |
| 2012/0280198 A1* | 11/2012 | Smythe | H01L 45/145 257/2 |
| 2013/0026437 A1* | 1/2013 | Song | H01L 45/04 257/4 |
| 2013/0028003 A1* | 1/2013 | Wang | G11C 13/0007 365/148 |
| 2013/0112934 A1* | 5/2013 | Yang | H01L 27/2463 257/4 |
| 2013/0175497 A1* | 7/2013 | Yang et al. | 257/5 |
| 2013/0181183 A1* | 7/2013 | Pellizzer | H01L 45/06 257/5 |
| 2013/0193397 A1* | 8/2013 | Lin | H01L 27/101 257/4 |
| 2013/0214230 A1* | 8/2013 | Sills | H01L 45/1253 257/1 |
| 2013/0234088 A1* | 9/2013 | Nishi et al. | 257/1 |
| 2014/0027700 A1* | 1/2014 | Nickel et al. | 257/3 |
| 2016/0028002 A1* | 1/2016 | Tortorelli | H01L 45/12 257/4 |

OTHER PUBLICATIONS

Chang, T., et al. "Synaptic behaviors and modeling of a metal oxide memristive device." *Appl Phys A* (2011), vol. 102, pp. 857-863. (published on Feb. 5, 2011).

Wheeler, D., et al. "CMOS-Integrated Memristors for Neuromorphic Architectures." *Semiconductor Device Research Symposium (ISDRS), 2011 International.* HRL Laboratories (2011), pp. 1-2.

Lai, Erh-Kun, et al. "Tungsten Oxide Resistive Memory Using Rapid Thermal Oxidation of Tungsten Plugs." *Japanese Journal of Applied Physics* 49 (2010), pp. 04DD17-1-04DD17-4.

* cited by examiner

US 9,450,022 B1

MEMRISTOR DEVICES AND FABRICATION

STATEMENT REGARDING FEDERALLY SPONSORED RESEARCH OR DEVELOPMENT

This invention was made with Government support under Contract No. HR0011-09-C-001 awarded by DARPA. The Government has certain rights in the invention.

BACKGROUND

Memristors are typically passive two-terminal electrical components. When current flows in one direction through the device, the electrical resistance increases, and when current flows in the opposite direction, the resistance decreases. When current is stopped the component retains its last resistance. Memristors can benefit from improved fabrication processes and structures.

SUMMARY

Some embodiments relate to a method for fabricating a digital memristor crossbar array that includes providing a first electrode layer on a substrate, applying a memristive layer on at least part of the first electrode layer, applying a protective layer on at least a portion of the memristive layer, etching the first electrode layer to form first electrode layer lines, such that the protective layer remains on the at least a portion of the memristive layer, coating the substrate with an insulating layer, removing at least a portion of the insulating layer, the protective layer remaining to protect the at least a portion of the memristive layer, removing the protective layer to expose the memristive layer, and forming a second electrode layer on an exposed portion of the memrisitve layer.

Some embodiments include a method for fabricating an analog memristor crossbar array including providing an insulating layer on part of a substrate, providing a trench within the insulating layer to expose a portion of a substrate surface, providing a first electrode layer on the insulating layer and in the trench, the first electrode layer connecting with the portion of the substrate surface to provide a self-aligning first electrode layer, planarizing the first electrode layer and the insulating layer to isolate the first electrode layer from adjacent electrode layer, providing a memristive layer on the planarized first electrode layer; and forming a second electrode on the memristive layer.

Some embodiments relate to an analog memristor that includes a first electrode comprising a conductive material arranged in a trench on a substrate along a length of the analog memristor. A memristive layer is arranged on the first electrode to form a memristive layer bar. A second electrode is in electrical connectivity with the memristive layer. The memristive layer bar is arranged to self-align the second electrode on the memristive layer along its length.

DETAILED DESCRIPTION

This disclosure relates to fabrication processes for and apparatus related to memristor crossbar arrays. In some embodiments, fabrication processes used to produce memristor crossbar arrays include one or more processes to protect memristive material during fabrication. This can improve surface flatness of bottom electrodes exposed during fabrication. The processes can produce relatively flat or smooth bottom electrodes during fabrication, allowing subsequent formation of top electrodes on surfaces with fewer voids, pits or bumps on the surface of the bottom electrodes. For example, minimizing the surface variation of bottom electrodes can help increase the yield of working devices and also reduce or eliminate parasitic current conduction through the sidewalls of the bottom electrode. In some embodiments, fabrication of memristor crossbar arrays provide for self-alignment of an electrode. In some embodiments, fabrication of memristor crossbar arrays includes providing vias for access to attached electronics. Non-patent publication, D. Wheeler et al. "CMOS-Integrated Memristors for Neuromorphic Architectures" *Proc. Int. Semicond. Device Res. Symp.*, December 2011, DOI: 10.1109/IS-DRS.2011.6135279, describes some features of memristors, the entirety of which is hereby incorporated by reference.

The fabrication process relates to various types of memristor devices. An embodiment of the present technology relates to one or more digital memristors arranged in an array. An embodiment of such digital memristors includes a filament memristor crossbar array. In some embodiments, such a filament array can be an Ag-filament memristor crossbar array, for example. Filament memristor crossbar arrays may be used in a variety of applications, such as digital circuits, for example, since the conductance of the device can "snap" or switch between low and high states.

Figure 1:
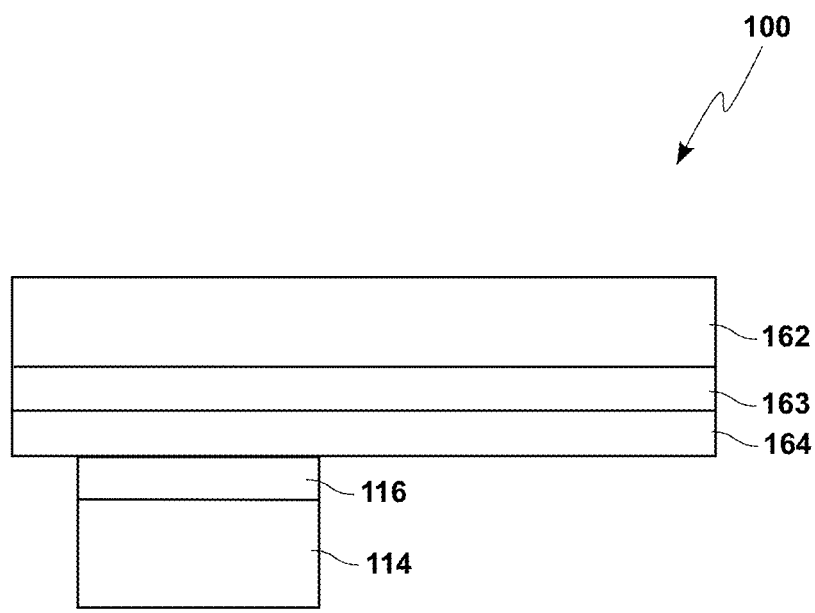
FIG. 1 is a diagram showing a cross section of a digital memristor.

FIG. 1 shows one embodiment of a single digital memristor 100. In some embodiments of the digital memristor 100, a memristive layer 116 is arranged between a first electrode layer 114 and a second electrode layer 162. A silver-containing layer 164 is either part of the second electrode layer 162, or its own separate layer. One or more additional layer(s) 163 may be arranged between the silver-containing layer 164 and the second electrode layer 162 to promote the adhesion of layer 164 to layer 162. The first electrode layer 114 may be a bottom electrode, and the second electrode layer 162 a top electrode of the digital memristor 100. When a "critical voltage" is reached between the top and bottom electrodes, a silver filament forms between them. In some embodiments, the silver filament can connect the electrodes. In some embodiments, the silver filament does not necessarily have to reach from one electrode to the other for current flow. In such embodiments, the silver filament is preferably within 1-2 nm of each electrode for current flow, or any distance that still permits current flow. When the voltage is reversed, the filament breaks up, shrinks and/or retracts, thereby breaking the electrical continuity between the electrodes. In some embodiments, the memristive layer 116 can be an amorphous layer, for example an amorphous Si (a-Si) layer and the first electrode layer 114 a metal, for example tungsten, bottom electrode.

Figure 2:
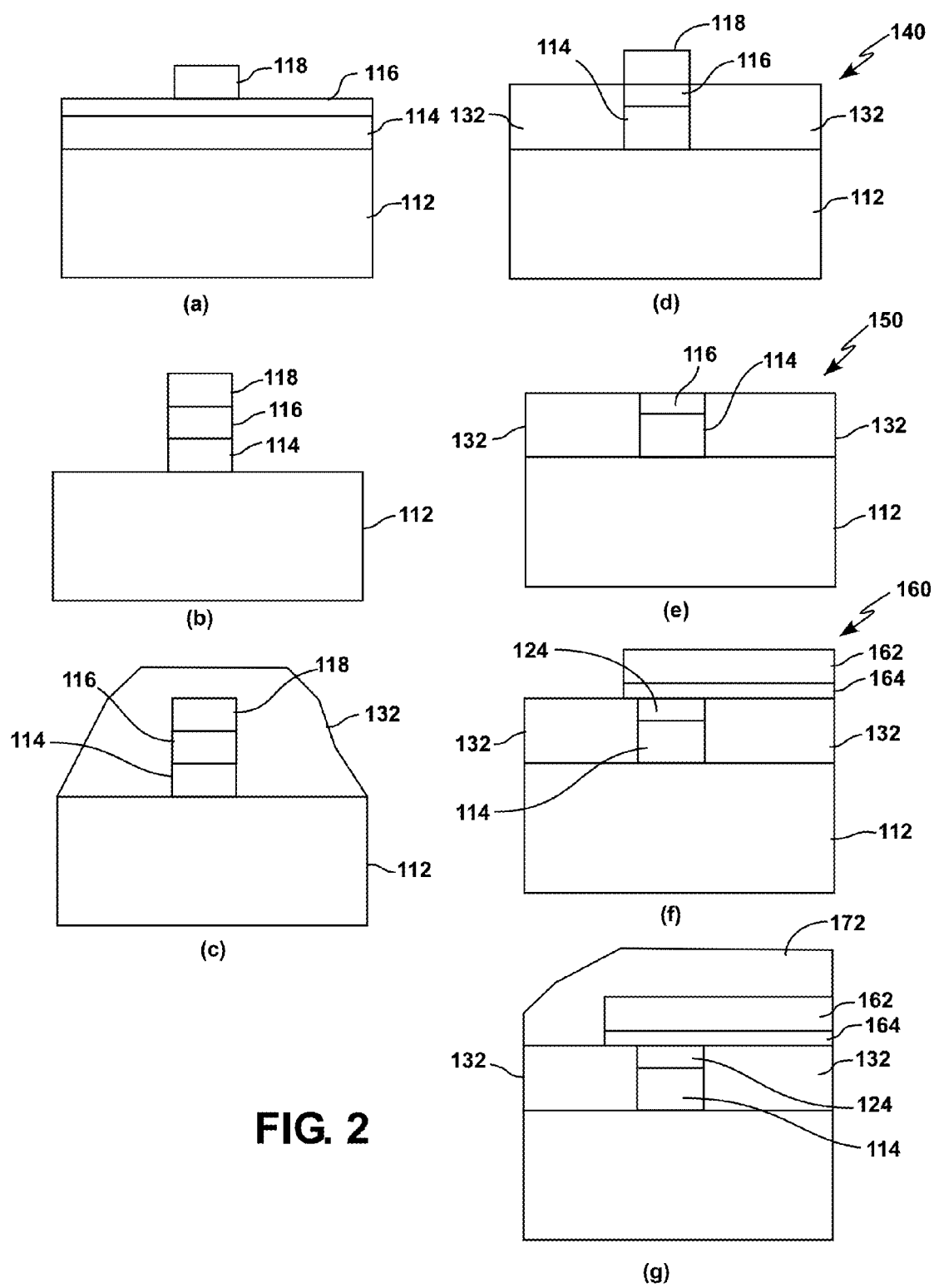
FIGS. 2(a)-2(g) are cross section flow diagrams showing fabrication of a digital memristor.

FIG. 2 shows one example of a process for fabricating a digital memristor crossbar array. As illustrated in FIG. 2 (a), fabrication of an analog memristor crossbar array includes definition of a first electrode.

The definition of a first electrode can include application and/or formation of a first electrode layer 114 on a substrate 112. In some embodiments, first electrode layer 114 comprises Tungsten (W), which can be deposited and/or applied by blanket deposition on the substrate 112, though other suitable deposition and/or layer formation techniques may be used. The thickness of first electrode layer 114 may be 30 nm, although other thicknesses can also be used. The first electrode layer 114 may comprise one or more bottom electrodes. In some embodiments, the first electrode layer 114 is arranged to be in electrical and/or physical connectivity with the substrate 112 and/or circuitry located therein or connected with the substrate 112. For example, the substrate 112 can comprise a partially-fabricated CMOS substrate from a CMOS foundry, though other substrate types may also be used.

A memristive layer 116 is formed on and/or formed on part or all of the first electrode layer 114. In some embodiments, the memristive layer 116 can comprise amorphous Si, and may be applied by deposition or other suitable technique. In some embodiments, memristive layer 116 can comprise SiGe/Si, although other compositions may be utilized. In some embodiments, the substrate 112 can include accessible metal vias at the surface to allow the memristors in the memristive layer 116 to connect to the underlying CMOS electronics of the substrate 112. Memristive layer 116 may be nm in thickness, though the layer is not limited to a particular thickness.

A protective layer 118 is applied and/or formed on memristive layer 116 to protect the memristive layer 116 and first electrode layer 114 from subsequent fabrication processes. Protective layer 118 preferably comprises hydrogen silsesquioxane (HSQ), which may be spin-coated, exposed with electron-beam lithography and developed. Alternative materials for use as the protective layer 118 may be used. Protective layer 118 also serves as an etch mask. Protective layer 118 may also be referred to as a "dummy" layer since it is used during fabrication, but is not part of the final device.

As illustrated in FIG. 2 (b), the first electrode layer 114 and memristive layer 116 may then be etched, preferably using a dry etch technique, to leave memristive layer 116 lines and first electrode layer 114 lines for crossbar arrays. Other etching techniques may be used instead of dry etching. Protective layer 118 remains on some or all of the top surface of the memristive layer 116 lines to protect the memristive layer 116 lines and first electrode layer 114 lines during subsequent fabrication processing.

As illustrated in FIG. 2 (c), the substrate 112 can be coated with an insulating layer 132. In some embodiments, the substrate 112 is spin-coated with spin-on-glass ("SOG"). In some embodiments, the insulating layer 132 is thus applied with spin coating. However, the insulating layer may be applied or formed on the substrate 112 using other techniques.

As illustrated in FIG. 2 (d), an etch-back process can remove at least a portion of the insulating layer 132. In some embodiments, the etch-back process is a SOG etch-back process and may also include planarization of the insulating layer 132. In such embodiments, the SOG etch-back process may be referred to as a SOG planarization etchback process. In some embodiments, this process may be performed with an inductively-coupled plasma (ICP) etch. The SOG etch back process can result in steps that are no greater than 20 nm. The CMP process can return the wafer to the original SiNx surface which is produced by IBM. The HRL-induced non-planarity can come from bumps where the tungsten features are. These bumps are typically no more than 10 nm in height. Using the ICP etch can achieve a smooth flat surface after the SOG has been applied. Due to the presence of the protective layer 118 on the memristive layer 116 and the first electrode layer 114 and/or memristive layer 116 lines and first electrode layer 114 lines, the memristive layer 116 and the first electrode layer 114 and/or memristive layer 116 lines and first electrode layer 114 lines are not damaged during the SOG etch-back process.

As illustrated in FIG. 2 (e), the protective layer 118 can be removed. Removal of the protective layer 118 can performed using a buffered oxide etch ("BOE") in some embodiments. The protective layer 118 may also be removed using other techniques.

As illustrated in FIG. 2 (f) a second electrode layer 162 is formed. The second electrode layer 162 may be formed by lifting off a series of lines perpendicular to the first electrode layer 114. The second electrode layer 162 may comprise one or more top electrodes. In some embodiments, each line may comprise a stack that includes, but is not limited to, metals such as Ag, Pt and/or Au shown as layer 163 in FIG. 1. Other metals may also be used. In some embodiments, a structure having a mesh of bottom and top electrode lines can include one or more memristive devices at an intersection of each top and bottom electrode.

As illustrated in FIG. 2 (g), the fabrication process can optionally include a coating of SOG which can seal the arrays from the environment to reduce negative effects such as aging.

Figure 3:
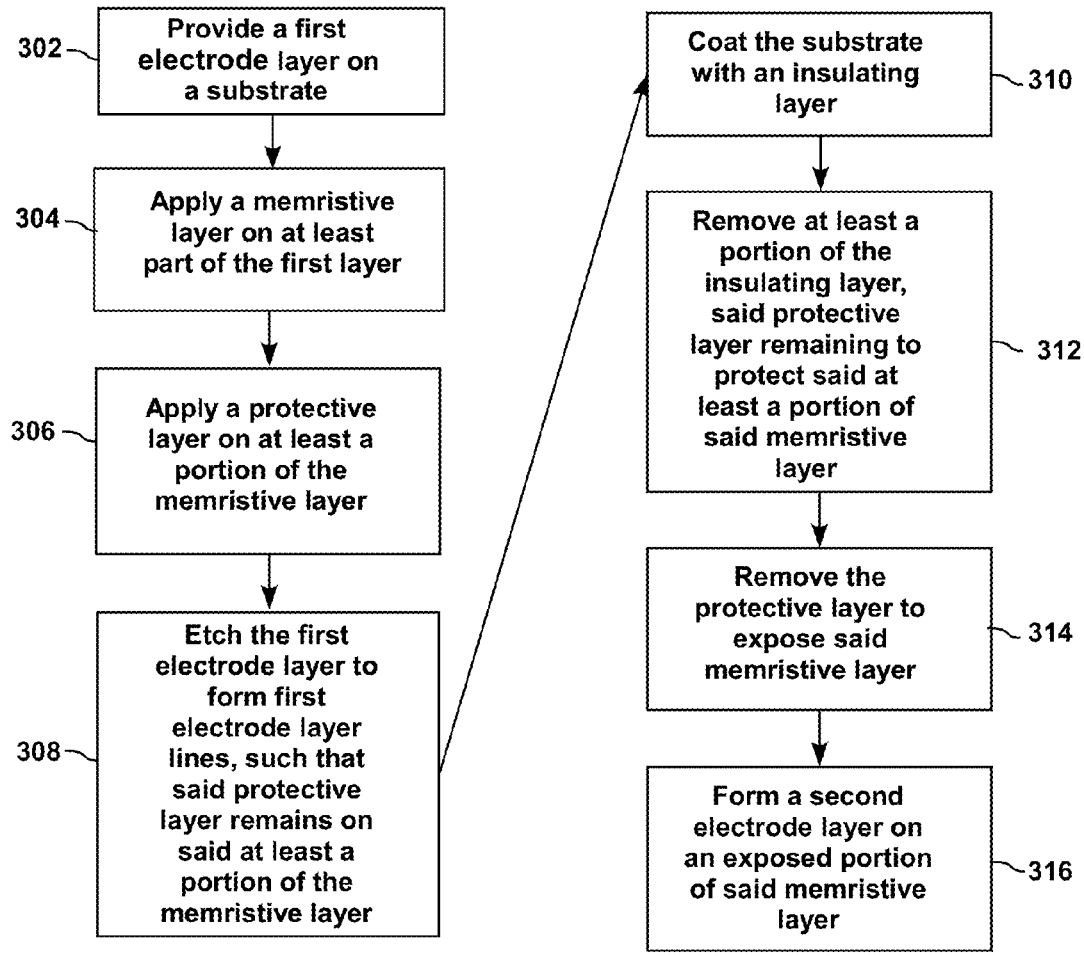
FIG. 3 is a flow diagram showing fabrication of a digital memristor.
Figure 4A:
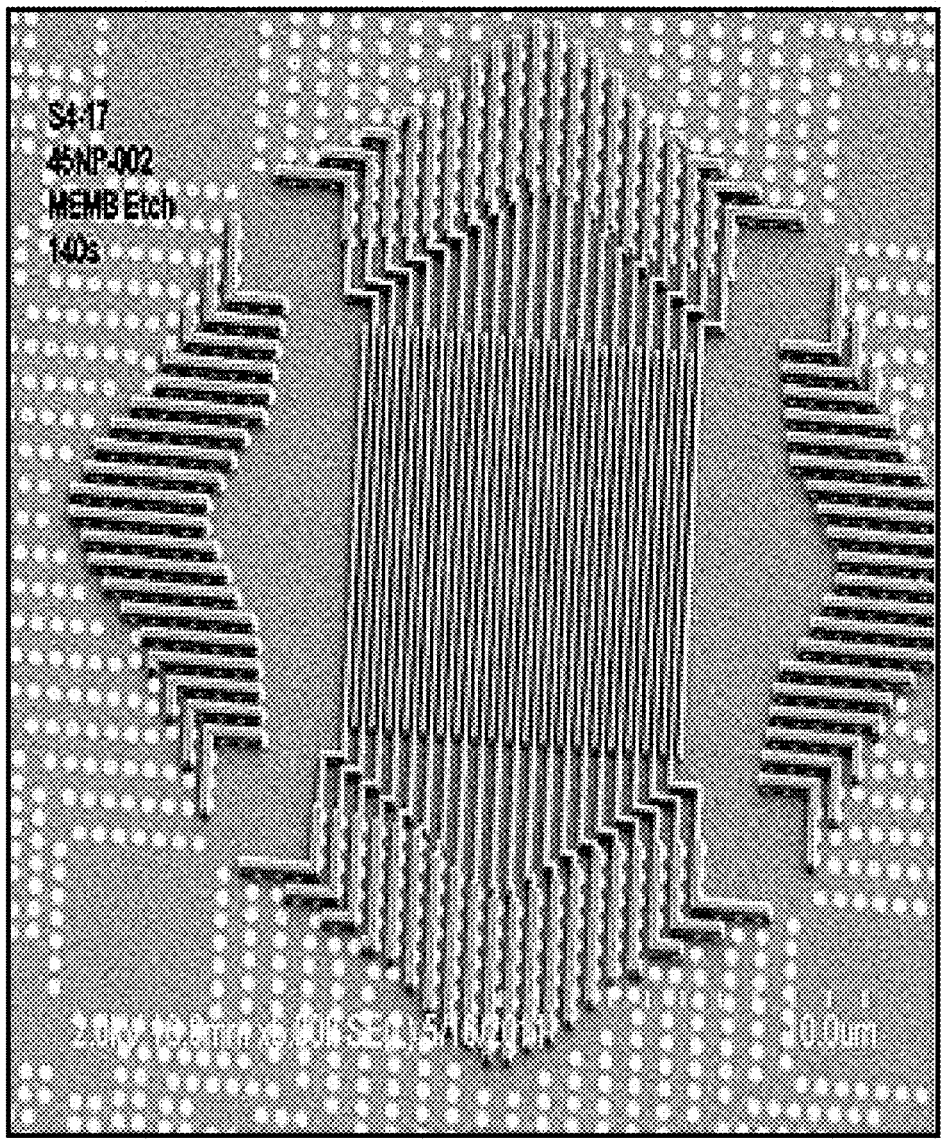
FIGS. 4(a)-4(d) are plan views of digital memristor images.
Figure 4B:
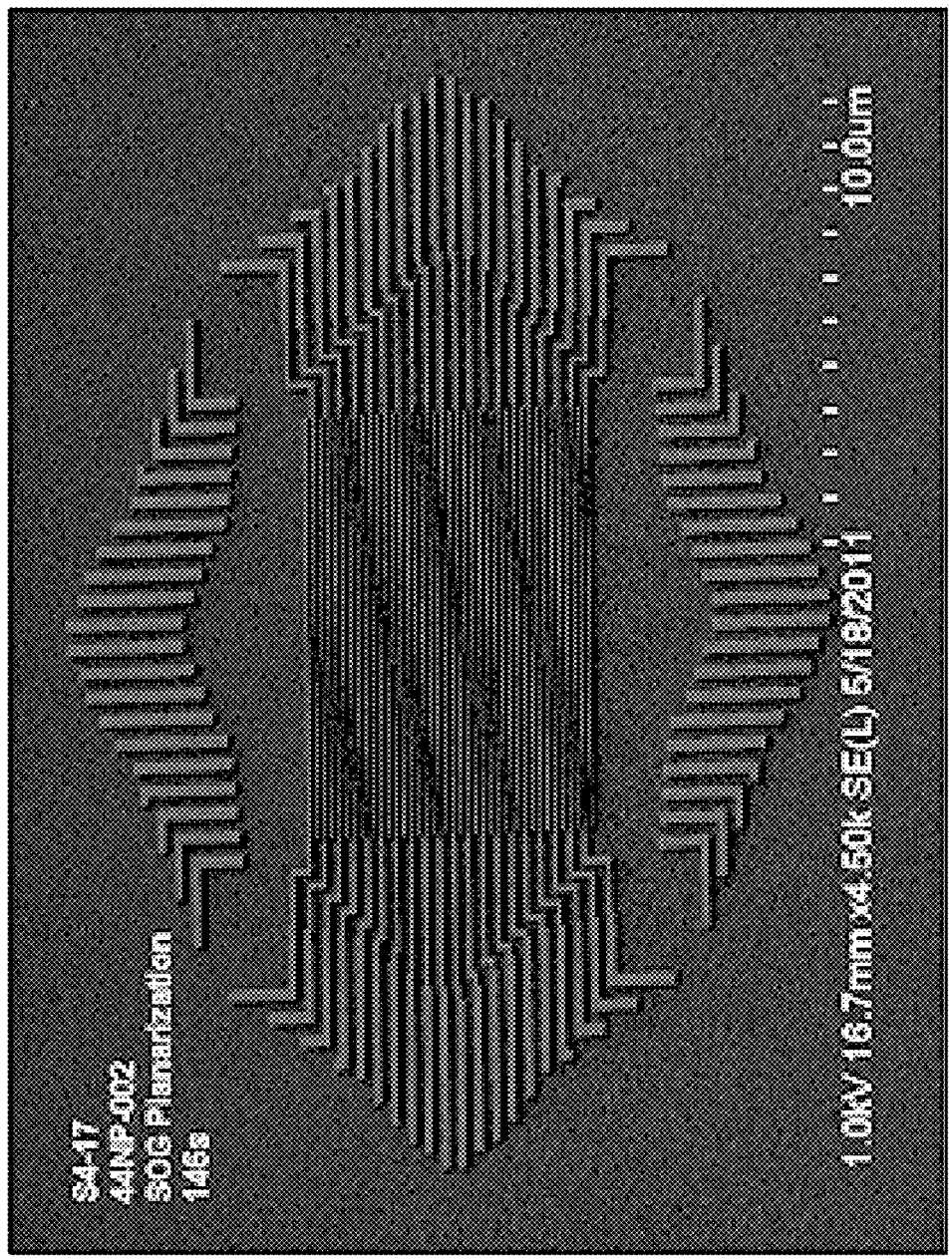
Figure 4C:
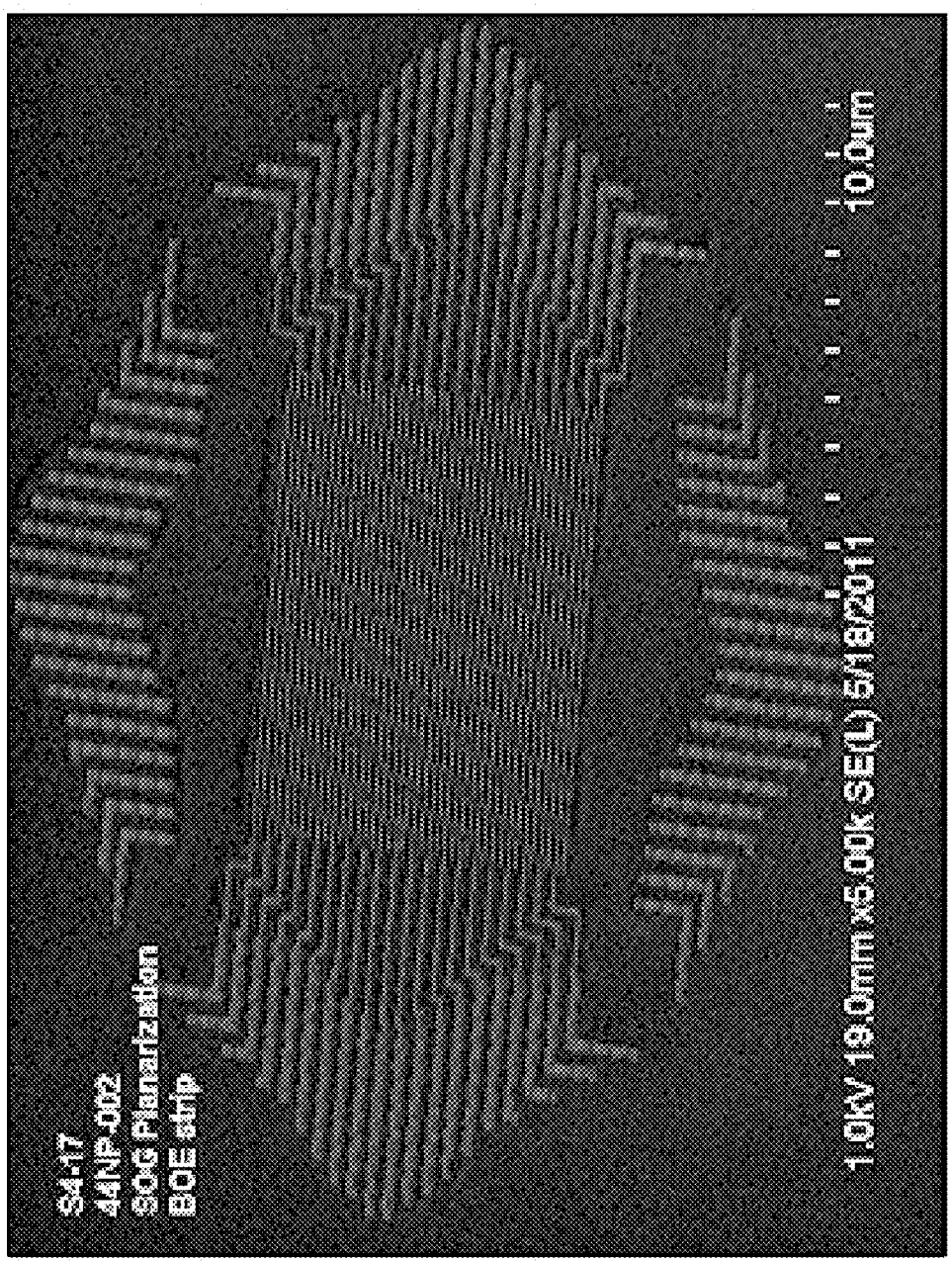
Figure 4D:
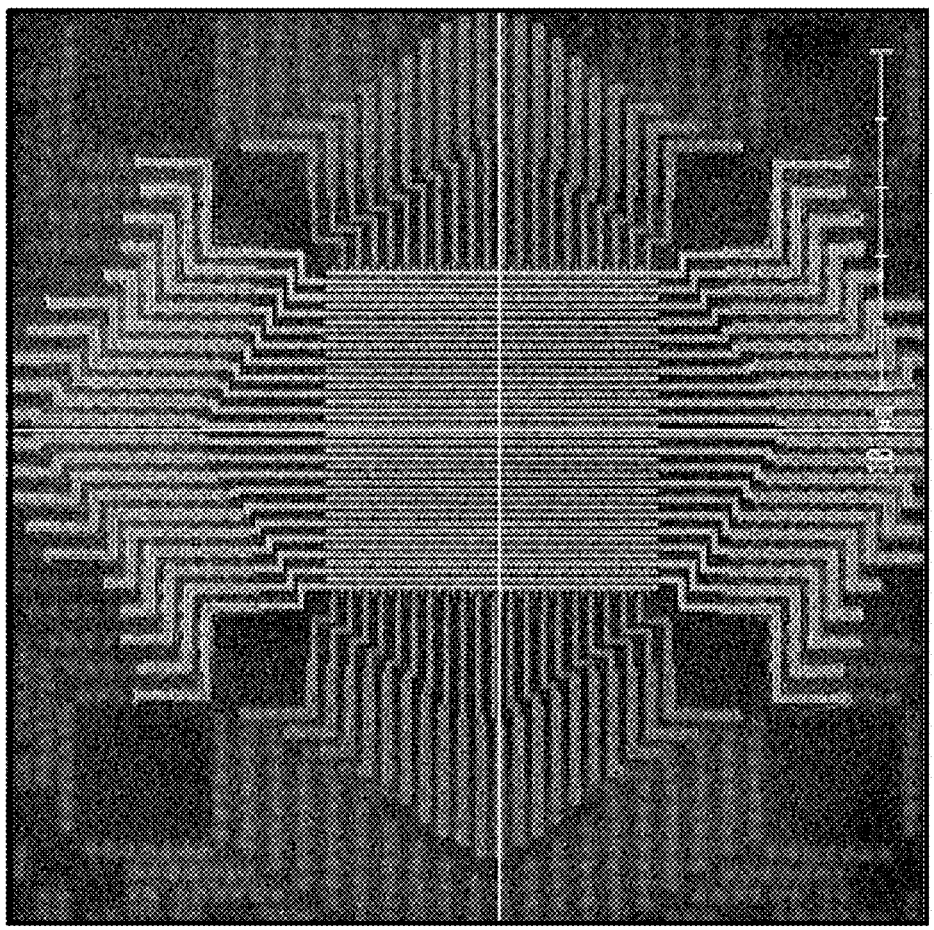

FIG. 3 is a flow diagram showing fabrication of a digital memristor. Fabrication includes providing a first electrode layer on a substrate 302, applying a memristive layer on at least part of the first electrode layer 304, applying a protective layer on at least a portion of the memristive layer 306, etching the first electrode layer to form first electrode layer lines 308, such that the protective layer remains on the at least a portion of the memristive layer, coating the substrate with an insulating layer 310, removing at least a portion of the insulating layer 312, the protective layer remaining to protect the at least a portion of the memristive layer, removing the protective layer to expose the memristive layer 314, and forming a second electrode layer on an exposed portion of the memristive layer 316. In some embodiments, the protective layer is removed with a wet chemical etch that only etches the protective layer and not the SOG and therefore does not impact the smoothness/flatness of the wafer. FIGS. 4(a)-4(d) are plan views of digital memristor crossbar array images.

In some embodiments of the digital memristor crossbar array, the first and second electrode layers 114 and 162 can comprise any metal. For example, the first and second electrode layers 114 and 162 can include Au, Al and/or W. In some embodiments, higher conductivity metals may be used. In some embodiments, one of the first and second electrode layers 114 and 162 preferably comprises Ag. Some embodiments include an adhesion layer that can be made with Ti, Cr, Pt and/or Pd. Some embodiments include a barrier layers that can be made with TaN, though other material may also be used. In some embodiments, the memristive layer 116 may be amorphous silicon, though other amorphous materials may also be used.

Another embodiment of the present technology relates to one or more analog memristors arranged in an array. An embodiment of such analog memristors includes a metal oxide memristor crossbar array. A metal oxide memristor crossbar array may be used in a variety of applications, such as analog circuits, for example, since the conductance of the device can change gradually between low and high states.

Figure 5:
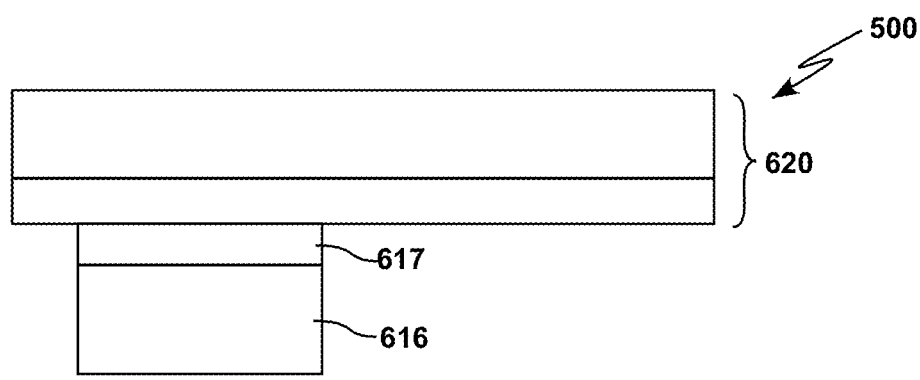
FIG. 5 is a diagram showing a cross section of an analog memristor.

FIG. 5 shows one embodiment of a single digital memristor 500. Digital memristor 500 includes a memristive layer 617 arranged between a first electrode layer 616 and a second electrode layer 620. The second electrode layer 620 may comprise a stack of metals, or may be a single metal layer. The first electrode layer 616 may be a bottom electrode, and the second electrode layer 620 a top electrode of the digital memristor 500.

Figure 6:
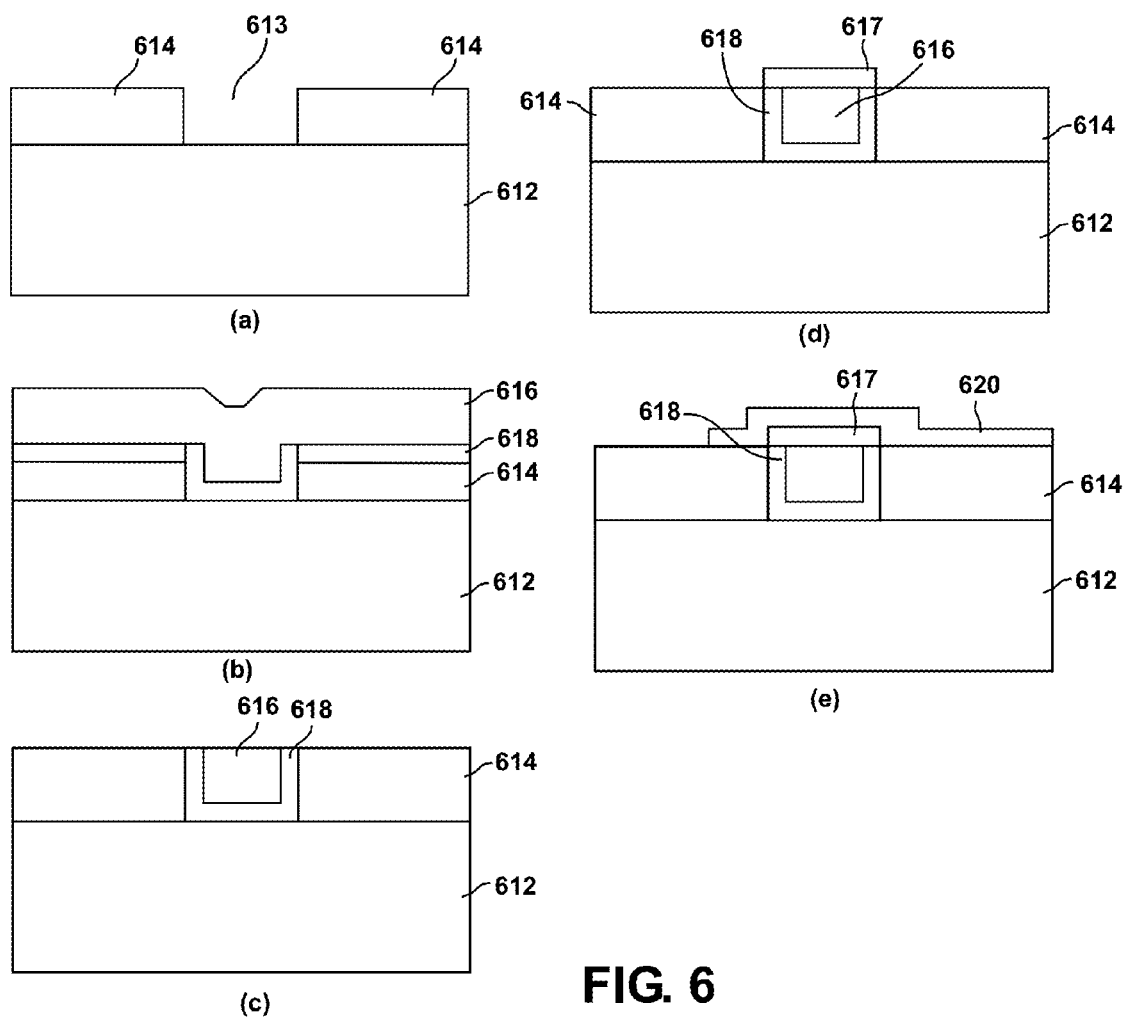
FIGS. 6(a)-6(e) are cross section flow diagrams showing fabrication of an analog memristor.

FIG. 6 shows one example of a process for fabricating an analog memristor crossbar array. As illustrated in FIG. 6 (*a*), fabrication of a digital memristor crossbar array includes definition of a first electrode. Definition of a first electrode includes application of an insulating layer 614 on a substrate 612. The substrate 612 can comprise a partially-fabricated CMOS substrate from a CMOS foundry, though other substrate types may also be used. In some embodiments, insulating layer 614 comprises SiNx, though other suitable insulating materials may also be used. In some embodiments, the insulating layer 614 preferably is formed, etched, and/or applied so as to define a trench 613. The trench 613 can provide location in which the first electrode resides. In some embodiments, the trench 613 extends as a continuous bar across a width or length of the memristor crossbar array.

As illustrated in FIG. 6 (*b*), fabrication of a metal oxide memristor crossbar array can include deposition of a first electrode layer 616. Before providing the first electrode layer 616, a thin layer of an adhesion or barrier material 618 can optionally be applied. The adhesion or barrier material 618 may be provided by sputtering or atomic layer deposition ("ALD"). In some embodiments, the adhesion or barrier material 618 may be less than 10 nm. In some embodiments, the adhesion or barrier material 618 is preferably a material with high electrical conductivity. In some embodiments, the adhesion material may be Ti, while a barrier material may be TaN. After deposition of the optional adhesion or barrier material 618, the first electrode layer 616 can be deposited. In some embodiments, the first electrode layer 616 is thick. For example, in some embodiments, the first electrode layer 616 can be over 70 nm thick. In some embodiments, the first electrode layer 616 may comprise a layer of W. In some embodiments, deposition of the first electrode layer 616 fills the vias 615 and trench(es) 613 if present. When the first electrode layer 616 is provided in the trench 613, it forms a continuous first electrode that extends the length of the memristor crossbar array. This allows for a self-aligning first electrode; when a second electrode is applied, it self-aligns with the memristive layer since it extends continuously. A memristor layer 617 provided on the electrode bar along its length can form a memristive layer bar 617. This allows for self-alignment of the top electrode on the memristive layer bar 617. In some embodiments, the self-alignment on the memristive layer bar 617 occurs along its entire length.

As illustrated in FIG. 6 (*c*), fabrication of an analog memristor crossbar array can include planarizing. In some embodiments, planarizing can include chemical mechanical polishing ("CMP") the tungsten layer using a colloidal-silica-based slurry featuring 50 nm particles, for example. Planarizing the wafer surface can reduce and/or eliminate undesirable surface topology on the top surface of the first electrode, resulting in second-electrode-step-coverage requirements no greater than 10 nm, for example. Planarizing the wafer surface can also provide isolation between all via and trenches by removing a portion of the first electrode layer 616 that connects between the vias and trenches after its deposition. After planarizing the vias and bottom electrodes are connected to underlying CMOS electronics, if present. In some embodiments, the planarization process can include mounting the wafer face down on a CMP polishing pad. The pad may be pre-conditioned by distributing a CMP slurry across it before the wafer is brought into contact. The polishing can begin by bringing the wafer into contact with the pre-conditioned pad and by rotating both the pad and wafer. About 2 psi of pressure may be applied to the wafer during polishing with the slurry, which can contain 50-nm-diameter particles of colloidal silica. Depending on the thickness of the tungsten, the wafer may be polished anywhere from 2-6 minutes. After polishing, the wafer is preferably immediately rinsed with de-ionized water and wiped with a cleanroom-grade wipe that is soaked in de-ionized water to remove residual slurry particles from the wafer.

As illustrated in FIG. 6 (*d*), fabrication of an analog memristor crossbar array includes providing a memristive layer 617. Memristive layer 617 can comprise WOx. In some embodiments, the memristive layer 617 is thermally grown, such as through thermal oxidation, for example. In some embodiments, the memristive layer 617 is provided using sputter deposition techniques. In some embodiments, the memristive layer 617 may be deposited by various deposition techniques, such as ALD, for example. Use of ALD for depositing the memristive layer 617 can allow for stoichiometric engineering of the memristive layer 617 at the atomic layer scale. This can allow for greater control of the metal oxide memristors' electrical properties, for example. Additionally, use of ALD can allow for controlling surface topology, to reduce surface anomalies, for example.

As illustrated in FIG. 6 (*e*), fabrication of an analog memristor crossbar array includes providing a second electrode. The second electrode can be provided by a variety of techniques. For example, the second electrode can be provided by lifting-off a series of lines perpendicular to the first electrode. Each line can comprise a stack 620 of metals including, but not limited to, Pd, Cr and/or Au metals. The resulting structure can be a mesh of bottom and top electrode lines, with each bottom-top electrode intersection being a single memristive device.

In some embodiments of the analog memristor crossbar array, the first and second electrode layers can be any metal. In some embodiments, the first and second electrode layers 616 and 620 are preferably metals that do not interfere with the memristive operation of the device by "gettering" oxygen. In some embodiments, higher conductivity metals may be used, including but not limited to metals such as Au, Cu and/or Al. Metals that can be thermally oxidized to produce the memristive material can be used. For example, W can be used as an electrode which once oxidized forms memristive material WOx. Many other metal oxides may be used for memristors, including, but not limited to: Al2O3, CuO, TiOx, TaO2, etc. Other metals include Al, Ti, Ni, Cu, Ru, Ag, W, Ir, Pt, and/or Au. In some embodiments of the analog memristor crossbar array, deposition of a metal oxide layer may be substituted for thermal oxidation. Such deposition can include sputtering, thermal or electron-beam evaporation, chemical vapor deposition ("CVD"), atomic-layer deposition ("ALD"), or plasma-enhanced CVD or ALD. In some embodiments, a metal oxide memristor crossbar array does not require an accessible metal via at the wafer surface since such vias to the underlying CMOS electronics may be created as part of the memristor processing. In some embodiments, the metal oxide memristor crossbar array can be a WOx memristor crossbar array.

Figure 7:
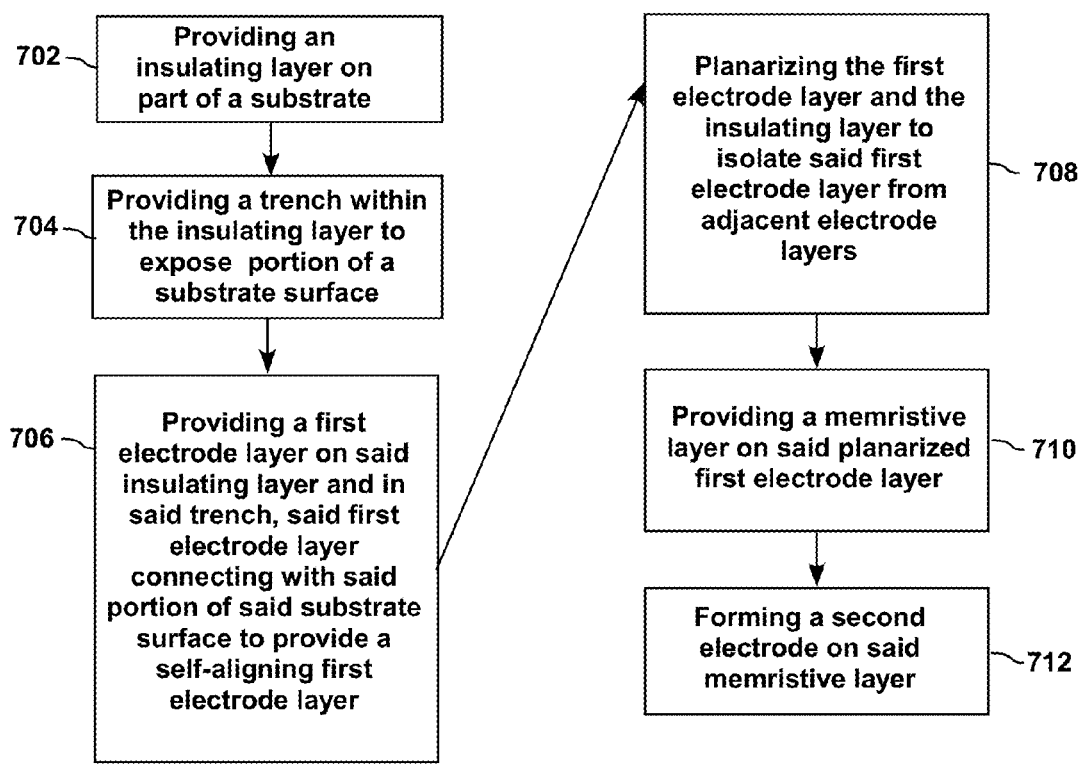
FIG. 7 is a flow diagram showing fabrication of an analog memristor.

FIG. 7 shows a flow diagram showing fabrication of an analog memristor which includes providing an insulating layer on part of a substrate 702, providing a trench within the insulating layer to expose a portion of a substrate surface 704, providing a first electrode layer on the insulating layer and in the trench 706, the first electrode layer connecting with the portion of the substrate surface to provide a self-aligning first electrode layer, planarizing the first electrode layer and the insulating layer to isolate the first electrode layer from adjacent electrode layer 708, providing a memristive layer on the planarized first electrode layer 710; and forming a second electrode on the memristive layer 712.

Figure 8:
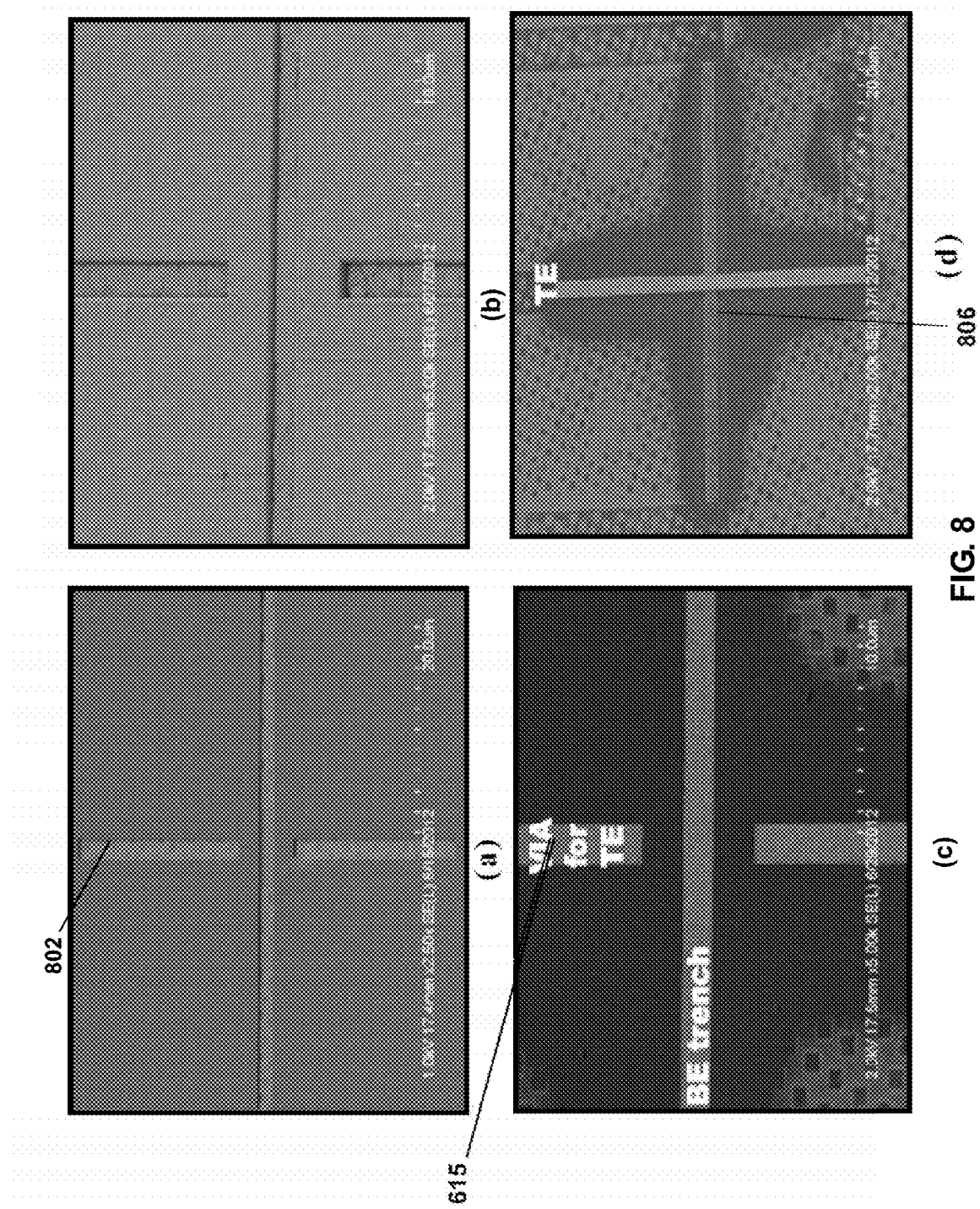
FIGS. 8(a)-8(d) are plan views of analog memristor images.

FIGS. 8(*a*)-8(*d*) shows plan views of one embodiment of an analog memristor. FIG. 8(*a*) shows after a first electrode definition, FIG. 8(*b*) after TaN/W sputter FIG. 8(*c*) after CMP, and FIG. 8(*d*) after formation of the second electrode. For illustrative purposes, 802 is the CMOS metal and 806 shows that use of a bottom electrode line enables the self aligned process; the top electrode does not have to align to a plug.

Figure 9:
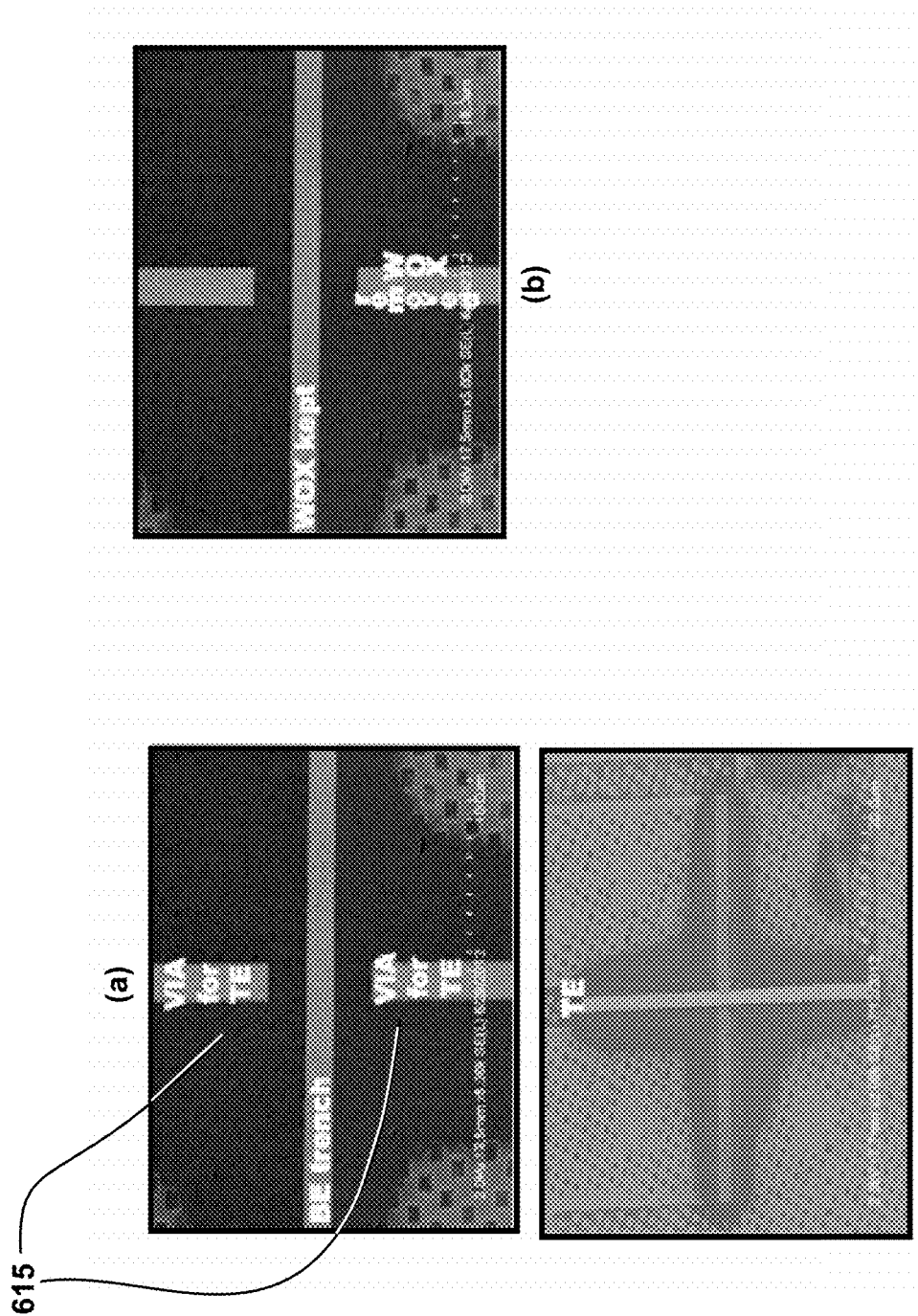
FIGS. 9(a)-9(c) are plan views of vias formed for memristors.

In some embodiments vias 615 can be etched for either digital or analog memristor crossbar arrays. FIGS. 9(*a*)-9(*c*) are plan views of vias formed in memristors. The vias 615 can open a hole through which the CMOS metal layers may be accessed by the top electrode. Vias differ from the bottom electrode because there is a step in which the memristive material (either a-Si or WOX) is removed from the vias, allowing the second electrode (e.g. top electrode) to make a direct, metal-to-metal contact with the first electrode (e.g. bottom electrode) metal (tungsten). Vias may be formed for either analog or digital memristor crossbar arrays. For some embodiments, FIG. 9(*a*) shows after the CMP & W surfaces are oxidized, FIG. 9(*b*) shows after WOx is etched from via areas, and FIG. 9(*c*) illustrates when the second electrode (e.g. top electrode) is formed, it makes direct contact with the first electrode (e.g. bottom electrode). The same type of process can be used for digital memristor vias; the memristive layer (e.g. a-Si) is selectively removed from the via areas.

Figure 10:
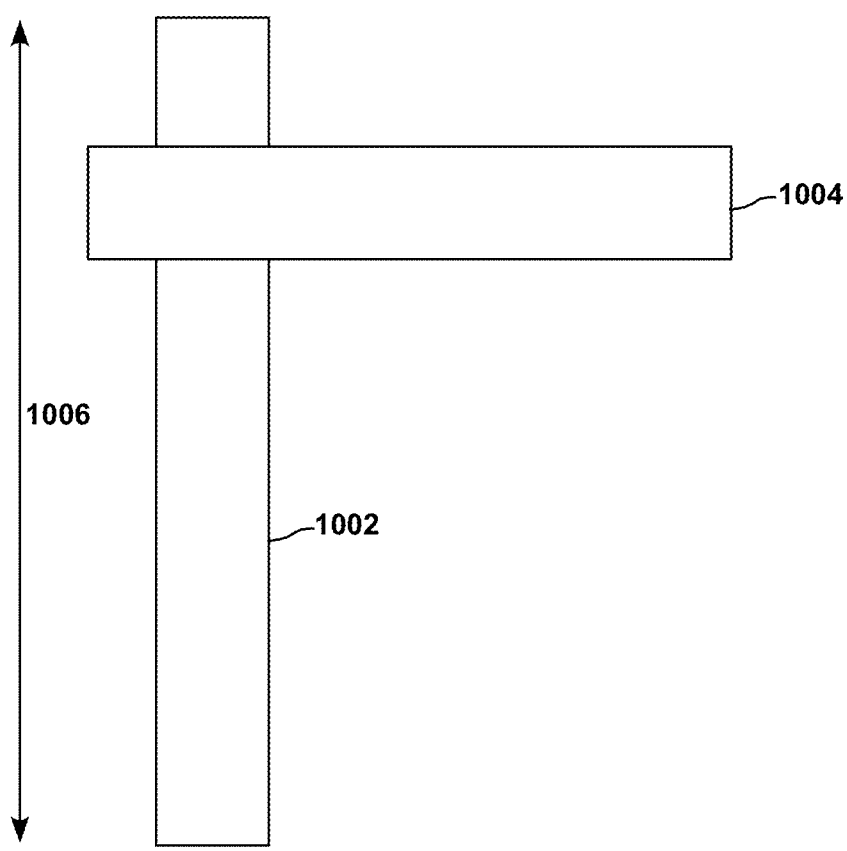
FIG. 10 is a plan view of a memristor device.

FIG. 10 is a plan view of a memristor device formed by the intersection of a first electrode bar 1002 having memristive material with a second electrode bar 1004. By filling in a trench with the first electrode and memristive material as described previously, the first electrode 1002 (e.g. bottom electrode) and memristive material form a continuous crossbar of memristive material rather than a single regional plug for connecting with the second electrode (e.g. top electrode). This allows for locating the second electrode 1004 anywhere along the length 1006 of the first electrode 1002, thereby making the first and second electrodes 1002 and 1004 self aligning.

Any steps or methods are not necessarily limited to a particular order or sequence by this disclosure. Additionally, the different embodiments and/or any features they describe may be interchangeable, and therefore partially or wholly combinable.

What is claimed is:

1. A method for fabricating an analog memristor crossbar array, comprising:
   providing an insulating layer on part of a substrate;
   providing a trench within the insulating layer to expose a portion of a substrate surface;
   providing a first electrode layer on said insulating layer and in said trench, said first electrode layer connecting with said portion of said substrate surface to provide a self-aligning first electrode layer;
   planarizing the first electrode layer and the insulating layer to isolate said first electrode layer from all adjacent electrode layers with the insulating layer;
   providing a memristive layer on said planarized first electrode layer; and
   forming a second electrode on said memristive layer;
   wherein said first electrode layer forms a continuous first electrode bar extending along the length of the memristor crossbar array;
   wherein said providing a memristive layer on said planarized first electrode layer comprises: providing a memristive layer bar along the length of said first electrode bar; and wherein said forming a second electrode on said memristive layer comprises forming a second electrode on said memristive layer bar wherein the memristive layer bar is arranged to self-align the second electrode on the memristive layer bar anywhere along the length of the first electrode bar.

2. The method of claim 1, wherein said insulating layer comprises SiNx.

3. The method of claim 1, wherein said planarizing comprises CMP.

4. The method of claim 1, wherein said memristive layer comprises WOx.

5. The method of claim 1, wherein said providing said memristive layer comprises ALD.

* * * * *